United States Patent [19]

Inami et al.

[11] 4,217,578
[45] Aug. 12, 1980

[54] FLUORESCENT INDICATOR TUBE AND RELATED CIRCUIT

[75] Inventors: Mamoru Inami; Yoshiaki Tanaka, both of Yokohama, Japan

[73] Assignee: Victor Company of Japan, Limited, Yokohama, Japan

[21] Appl. No.: 863,956

[22] Filed: Dec. 23, 1977

[30] Foreign Application Priority Data

Dec. 29, 1976 [JP] Japan .................................. 51/160669
Dec. 29, 1976 [JP] Japan .................................. 51/160670

[51] Int. Cl.² ........................................... H01J 17/48
[52] U.S. Cl. ................................... 340/754; 313/497; 324/121 R; 340/772
[58] Field of Search ........ 340/324 R, 324 M, 166 EL, 340/343, 758, 759, 753, 754; 315/169 R, 169 TV; 313/492, 497, 516, 519

[56] References Cited

U.S. PATENT DOCUMENTS

| | | | |
|---|---|---|---|
| 3,824,581 | 7/1974 | Ohno | 340/324 R |
| 3,922,666 | 11/1975 | Inami et al. | 315/169 R |
| 3,967,158 | 6/1976 | Saxon | 315/169 TV |
| 3,973,166 | 8/1976 | Maloney | 315/169 TV |
| 3,987,392 | 10/1976 | Kugelmann et al. | 340/324 R |
| 4,047,073 | 9/1977 | Kishino | 313/497 |

*Primary Examiner*—David L. Trafton
*Attorney, Agent, or Firm*—Lowe, King, Price & Becker

[57] ABSTRACT

A fluorescent signal level indicator includes two parallel rows of anode electrodes coated with a layer of fluorescent material to emit light when energized in response to an input analog signal exceeding a corresponding one of graduated reference potentials. A cathode electrode is provided for emitting electrons toward the anodes and a grid electrode is mounted between the cathode and anode electrodes for controlling the amount of electrons passing therethrough.

9 Claims, 14 Drawing Figures

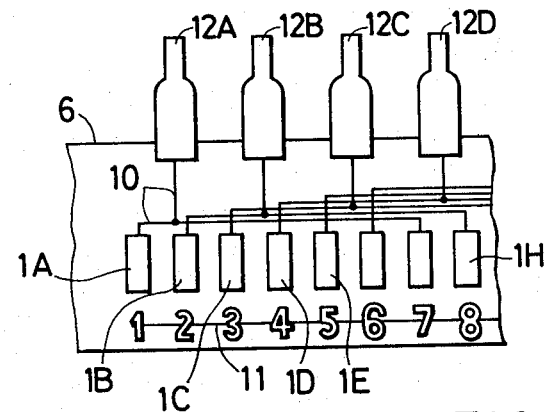
FIG. 3
FIG. 4a
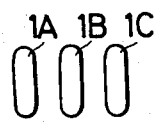
FIG. 4b
FIG. 4c
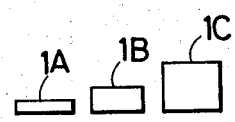
FIG. 4d
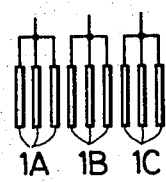
FIG. 6a
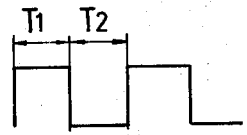
FIG. 6b
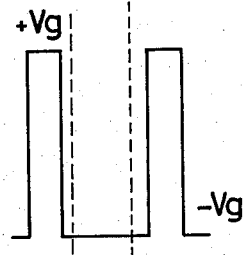
FIG. 6c
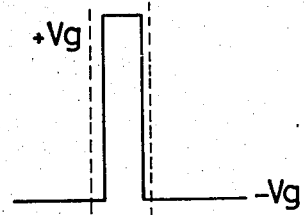
FIG. 6d

FLUORESCENT INDICATOR TUBE AND RELATED CIRCUIT

The present invention relates to a fluorescent indicator tube and related circuits which are, in combination, suitable for a level indication for audio signals.

Various fluorescent indicator tubes have been developed, each of which has some disadvantages such as low reproductivity, high manufacturing cost, unsuitably for accommodation within a limited space, and so on. These disadvantages will be referred to again later in connection with a preferred embodiment of the present invention.

An object of the present invention is to provide an improved fluorescent indicator tube without the above-mentioned disadvantages inherent to prior art.

Another object of the present invention is to provide an improved electronic circuit for driving a fluorescent indicator tube or a suitable light emitting device.

These and other objects, features and many of the attendant advantages of this invention will be appreciated more readily as the invention becomes better understood by the following detailed description, when considered in connection with the accompanying drawings, wherein like parts in each of the several figures are identified by the same reference characters, and wherein:

FIG. 1b is a cross sectional view taken along a line A—A' of FIG. 1a;

FIG. 3 is an illustration of an electrical connection of a portion of the embodiment of FIG. 1a;

Figure 1A:
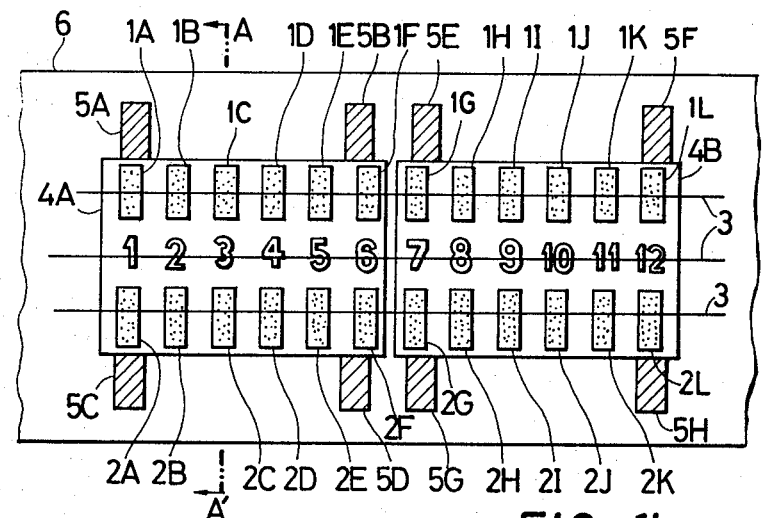
FIG. 1a is an illustration of a first preferred embodiment of the present invention.
Figure 5:
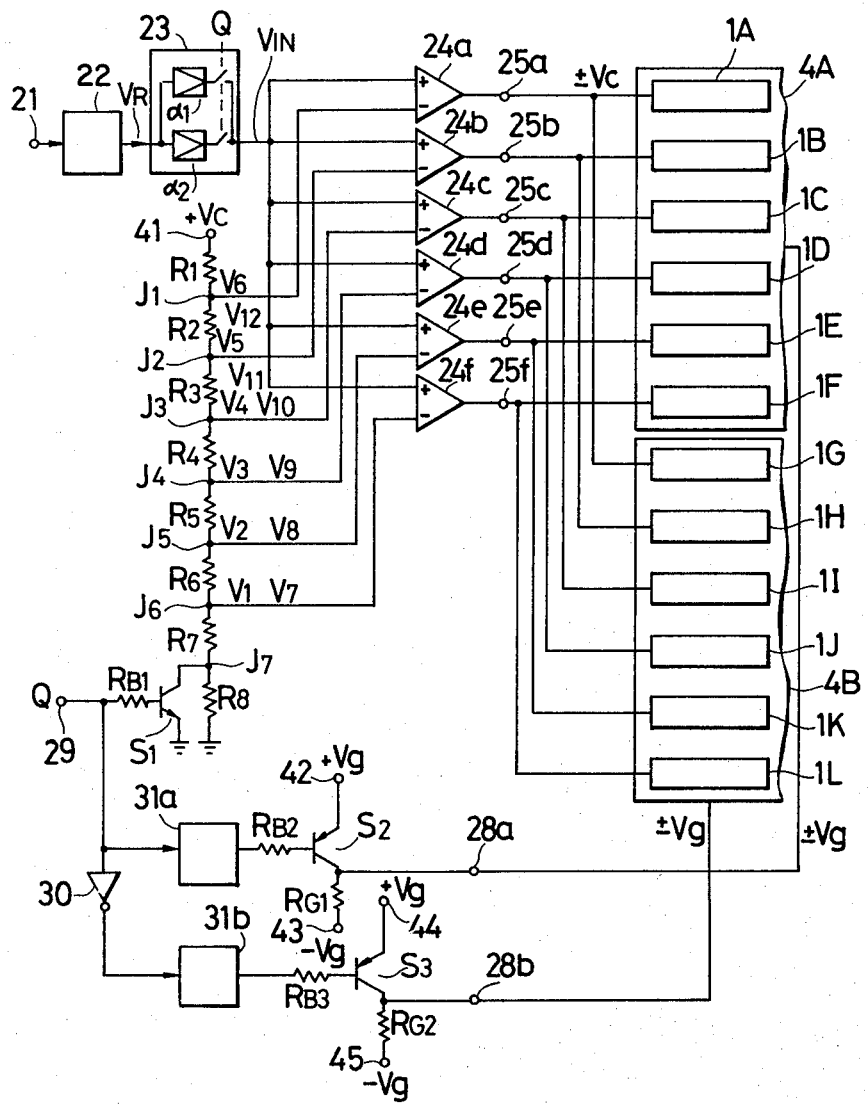
Figure 7:
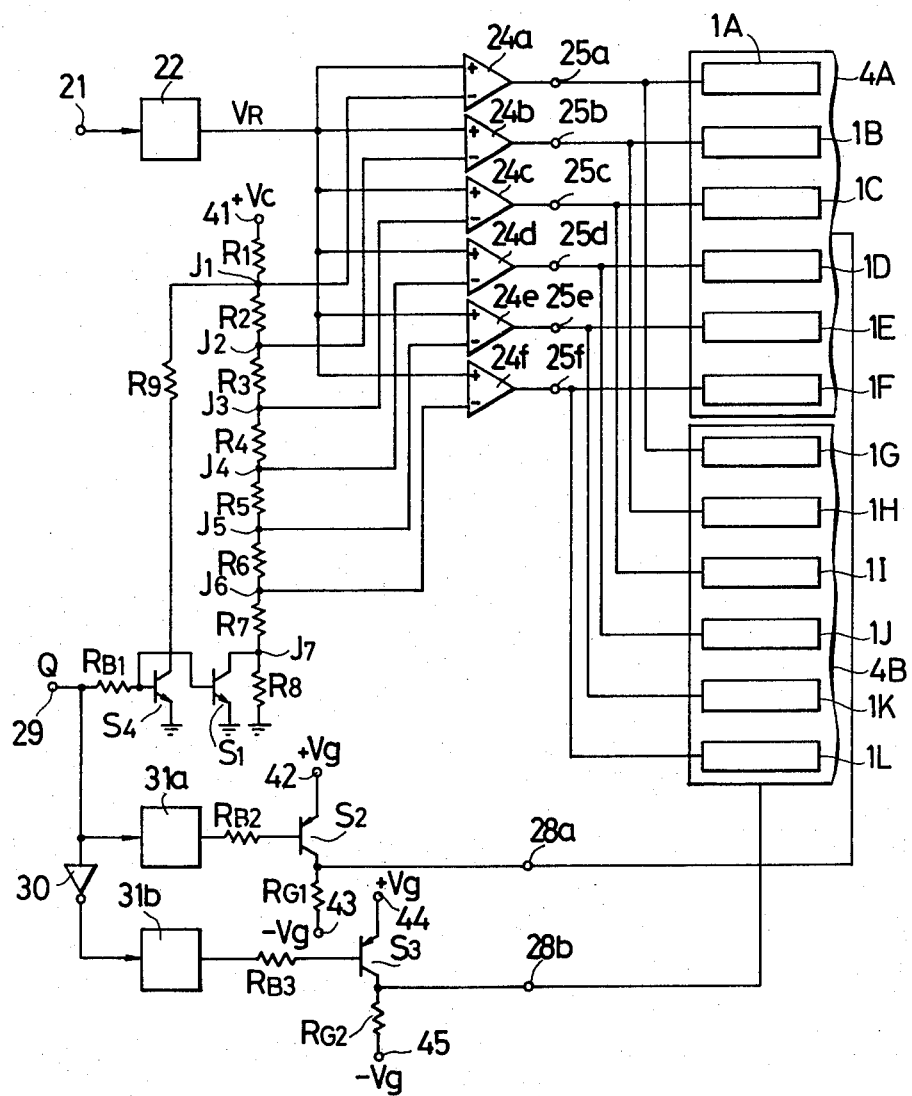

FIGS. 4a–4d each is an illustration of a modification of a part of the embodiment of FIG. 1a;

FIG. 5 illustrates a second preferred embodiment of the present invention for use with the first one;

FIGS. 6a–6d are waveforms of signals appearing in the second preferred embodiment; and FIG. 7 is a modification of the second preferred embodiment.

Figure 1B:
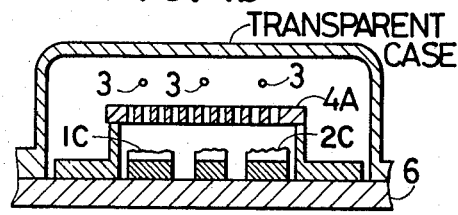

Reference is now made to FIGS. 1a and 1b illustrating a first preferred embodiment of the present invention, i.e., a fluorescent indicator tube for indicating the level of AC signals such as audio signals applied to the tube in a bar graphic manner. A dielectric substrate 6 is disposed within a vacuum tube (not shown). Twenty four fluorescent indicator segments 1A–1L and 2A–2L are provided on the substrate 6 in two arrays. Each of the fluorescent indicator segments includes an anode plate and suitable fluorescent material provided thereon. Twelve figure segments 1–12 are provided on the substrate 6 and between the two arrays of the indicator segments 1A–1L and 2A–2L, specifying the level represented by the two arrays of the fluorescent indicator segments. Two grids 4A and 4B are supported, by means of supports 5A–5H, on the substrate 6 in such a manner as to cover the fluorescent indicator segments 1A–1L and 2A–2L and the FIGS. 1–12. Above the grids 4A and 4B a suitable filament 3 is provided for emitting electrons. The grids 4A and 4B control the amount of electrons reaching the segments 1A–1L and 2A–2L together with varying DC voltages applied to the segments.

As the grid 4A covers two parallel rows of the fluorescent indicator segments 1A–1F and 2A–2F and the grid 4B covers two parallel rows of the segments 1G–1L and 2G–2L, the first preferred embodiment features that the FIGS. 1–12 can be arranged close to the segments 1A–1L and 2A–2L. This results in a compact, low cost level indicator.

Figure 2:
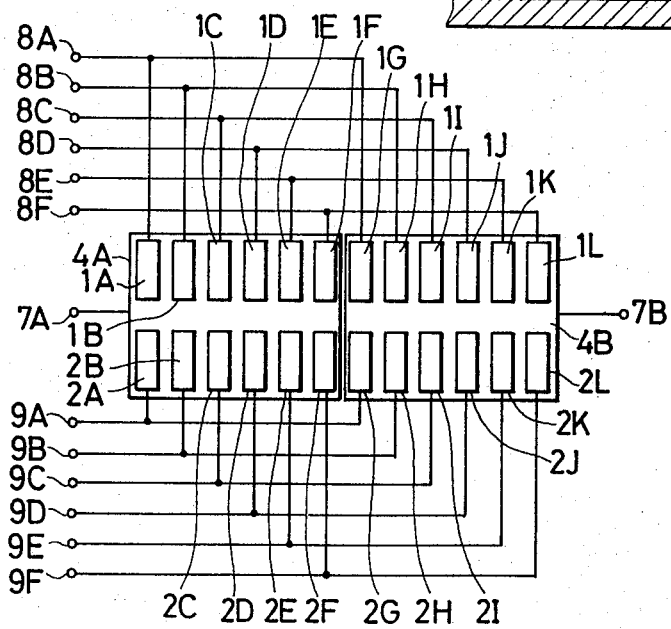
FIG. 2 is an illustration of an electrical connection of the embodiment of FIG. 1a with external circuitry.

In FIG. 2, there is illustrated electrical connection of the indicator segments 1A–1L and 2A–2L with an external circuit, wherein the figure segments 1–12 are omitted for clarity. Each of terminals 8A–8F is connected to two of the segments 1A–1L as clearly shown in FIG. 2. Each of terminals 9A–9F is, on the other hand, connected to two of the segments 2A–2L. Twelve comparators (not shown) are connected to the terminals 8A–8F and 9A–9F, respectively, applying suitable DC voltages to the segments in response to the level of the AC signals fed to the comparators. Reference numerals 7A and 7B indicate terminals for the grids 4A and 4B, respectively.

FIG. 3 illustrates a portion of practical connections of the first preferred embodiment. Conductive layers 10 and 11 are disposed on the dielectric substrate 6 by a suitable method. Terminals 12A, 12B, 12C, 12D are firmly attached to the end of the substrate 6, connected to the conductive layer 10. The conductive layers 10 and 11 are then covered by dielectric layer, and then the supports 5A–5H are attached on the substrate 6.

The configurations of the indicator segments 1A–1L and 2A–2L are not limited to rectangles as shown in FIG. 1a, but various modifications are available some of which are illustrated in FIGS. 4a–4d. In FIG. 4c, indicator segments with different areas are illustrated which are desirable when, for example, each of the areas is determined to be proportional to the level of the incoming AC signal.

In the above, the figure segments 1–12 can be replaced with another suitable signs such as letters. Furthermore, the number of fluorescent indicator segment and that of the grid are not limited to twenty four and two. When the number of the arrays (two in FIG. 1) is more than 3, the signs for specifying the level are provided between each pair of the arrays.

In FIG. 5 there is illustrated a second preferred embodiment of the present invention, i.e., an electrical circuit for the fluorescent indicator tube as shown in FIG. 1. A suitable rectifier 22 is connected to a terminal 21 to which an AC signal is applied. The rectifier 22 is connected to an amplifier 23 which changes alternatively its amplification degrees $\alpha_1$, $\alpha_2$ in response to a pulse signal Q applied to the amplifier 23. The output of the amplifier 23 is connected to one of two input terminals of each of six comparators 24a–24f. The other input terminals of each of the comparators 24a–24f are coupled to six junctions J1–J6, respectively, for receiving reference DC voltages therefrom. Eight resistors R1–R8 are connected in series between a terminal 41 and ground, generating the reference voltages at the junctions J1–J6. The terminal 41 is connected to a DC power source (not shown), receiving $+V_c$. The collector and emitter of transistor S1 are connected to a junction j7 and ground, respectively. The base of the transistor S1 is coupled to a terminal 29 via a resistor $R_{B1}$, receiving the pulse signal Q therefrom. The outputs of the comparators 24a–24f are connected via terminals 25a–25f to the indicator segments 1A–1F and 1G–1L, respectively. Meanwhile, the terminal 29 is connected to a blanking circuit 31a and also via an inverter 30 to another blanking circuit 31b. The blanking circuit 31a is connected via a resistor $R_{B2}$ to the base of a transistor S2. The emitter of the transistor S2 is connected to a terminal 42 receiving a DC voltage $+V_g$, and its collector is connected via a resistor $R_{G1}$ to a terminal 43 receiving a negative DC voltage $-V_g$. The output of the inverter 30 is connected to the base of a transistor S3 via the blanking circuit 31b and a resistor $R_{B3}$. The emitter of the transistor S3 is connected to a terminal 44, receiving a DC voltage $+V_g$ and its collector is connected via a resistor $R_{G2}$ to a terminal 45 receiving a negative DC voltage $-V_g$. The collectors of the transistors S2 and S3 also are connected to the grids 4A and 4B via terminals 28a and 28b, respectively. Each of the blanking circuits 31a and 31b prevents a so-called closs talk phenomenon occurring between anode electrodes of, for example, segments 1A and 1G.

The operation of the FIG. 5 circuit will be discussed together with FIGS. 6a-6c. The rectifier 22 receives the AC signal through the terminal 21 generating a rectified voltage $V_R$ therefrom. The waveform of the signal Q is shown in FIG. 6a. The amplifier 23 amplifies the voltage $V_R$ by $\alpha_1$ during a time period $T_1$ of the pulse signal Q and by $\alpha_2$ during $T_2$. The signal Q is also applied to the transistor S1 rendering it conductive during $T_1$ and nonconductive during $T_2$. It is therefore understood that when the transistor S1 is rendered conductive the voltage at the junction J7 is equal to about zero. In FIG. 6c, the voltage waveform at the collector of the transistor S1 is illustrated. It is assumed that voltages at the junctions J1-J6 are V6-V1 respectively, during the conductive state of the transistor S1 and respectively V12-V7 during its non-conductive state. The voltages V1-V12 are selected to satisfy the following relations:

$$\frac{V_1}{\alpha_1} < \frac{V_2}{\alpha_1} < \ldots < \frac{V_6}{\alpha_1} < \frac{V_7}{\alpha_2} < \ldots < \frac{V_{12}}{\alpha_2}$$

As for example, in order to get a VU(Volume-Unit) meter indicating $-20$, $-14$, $-10$, $-7.5$, $-5$, $-3$, $-2$, $-1$, $0$, $+1$, $+2$, $+3$ (dB) (0 dB=0.775 v) wherein $V_c=15$ v, $\alpha_1 \div 5.62$, $\alpha_2 \div 4.57$, the following relations should be satisfied:

$R_2/R_1 \div 0.0545$, $R_3/R_1 \div 0.0485$,
$R_4/R_1 \div 0.043$, $R_5/R_1 \div 0.0385$,
$R_6/R_1 \div 0.0345$, $R_7/R_1 \div 0.0415$,
$R_8/R_1 \div 0.2390$ Each of the comparators 24a-24f generates a high level voltage (for example, a source voltage $+V_c$) when the voltage from the amplifier 23 exceeds the reference voltage ($V_1$, $V_2$, ..., $V_{11}$, or $V_{12}$), and generating a low level (for example, $-V_c$) when the voltage from the amplifier 23 is below the above mentioned reference voltage. The high or low level voltages from the comparators are then fed to the anodes of the indicator segments 1A-1L.

The signal Q and its inverted one are respectively applied to the blanking circuits 31a and 31b, respectively. Each of the circuits 31a and 31b is identical with the other, designed to make narrow the pulse width of the positive going pulse, and including usually a monostable multivibrator. The circuits 31a and 31b are used for preventing a cross talk as previously referred to.

The transistor S2 is rendered nonconductive during T1 and $+V_g$ is applied to the grid 4A, and rendered conductive during T2 and $-V_g$ is applied to the grid 4A. A waveform of the voltage applied to the grid 4A is shown in FIG. 6b. As the inverted signal of the signal Q is added to the base of the transistor S3, the grid 4B receives a voltage whose waveform is shown in FIG. 6c.

Therefore, as the voltage $+V_g$ is applied to the grid 4B during the time period T1, the lower level ($V_1/\alpha_1$, $V_2/\alpha_1$, ..., $V_6/\alpha_1$) is ready to be represented by the indicator segments 1G-1L. On the other hand, as the voltage $+V_g$ is applied to the grid 4A during the time period T2, the higher level ($V_7/\alpha_2$, $V_8/\alpha_2$, ..., $V_{12}/\alpha_2$) can be represented by the indicator segments 1A-1F. By way of example, when $V_R=1.5$ dB, the segments 1C-1L are energized to emit light therefrom. More specifically, if the frequency of the signal Q is selected to be higher than a critical flicker frequency, the above mentioned lower and higher levels can be represented actually at the same time.

FIG. 7 illustrates a modification of the circuit of FIG. 6. Differences between the circuits of FIGS. 6 and 7 are that in FIG. 7 the amplifier 23 is omitted and a resistor R9 and a transistor S4 are added. When the transistor S1 is rendered conductive, the transistor S4 is also rendered conductive to provide a shunt across the resistors R2-R7, so that the reference voltages at the junctions J1-J6 can be changed in response to the signal Q.

In the above, although the circuit of FIG. 5 is referred to in connection with the fluorescent indicator tube of FIG. 1, it is able to be used with a light emitting device with two electrodes such as a light emitting diode. FIG. 5 illustrates a circuit for one incoming AC signal, but it is clear that more than two signals can be dealt with by adding comparators and related circuits 22 and 23 with use in common of the reference voltages $V_1$-$V_{12}$. Furthermore, the resistors R1-R8 can be replaced with operational amplifiers generating stepped reference voltage.

An many changes should be made in the above preferred embodiments and many apparently widely different embodiments of this invention could be made without departing from the scope thereof, it is intended that all matter contained in the above description or shown in the accompanying drawings shall be interpreted as illustrative and not in a limited sense.

What is claimed is:

1. A level indicator for indicating the level of multi-channel analog signals, comprising within an evacuated envelope:
    first and second parallel rows of successively arranged anode electrodes each being coated with a layer of fluorescent material therein for emission of light in response to an impingement of electrons thereto when each anode electrode of said first row is energized in response to one of said multi-channel signals exceeding a corresponding one of graduated reference potentials and when each anode electrode of said second row is energized in response to the other of said multi-channel signals exceeding a corresponding one of said graduated reference potentials;
    a cathode electrode for emitting electrons toward said anode electrodes; and
    a grid electrode mounted between said cathode and anode electrodes covering said parallel rows of said anode electrodes for controlling the amount of electrons passing therethrough,
    first and second variable length bar displays being generated by said first and second parallel rows of anode electrodes independently in response, respectively, to first and second signals.

2. A level indicator as claimed in claim 1, wherein each of said anode electrodes of each row is rectangular-shaped and arranged in side-by-side relation with each other.

3. A level indicator as claimed in claim 1, further comprising a third row of successively arranged additional anode electrodes between said first and second rows of said anode electrodes, said additional anode electrodes corresponding to the anode electrodes of said first and second rows and respectively shaped into the figure of numerals to numerically indicate the position of the corresponding anode electrodes in said first and second rows, each of said additional anode electrodes being coated with a layer of fluorescent material to emit light in response to an impingement of electrons from said cathode electrode.

4. A level indicator as claimed in claim 1, wherein said cathode electrode comprises first and second filaments spaced from and extending across said first and second rows of said anode electrodes, respectively.

5. A level indicator as claimed in claim 3, wherein said cathode electrode comprises a filament spaced from and extending across said third row of said additional anode electrodes.

6. A level indicator for indicating the level of an analog signal, comprising:
   means for establishing a plurality of graduated reference potentials;
   a plurality of comparators each having first and second input terminals, the first input terminals being respectively biased at said graduated reference potentials and the second input terminals being connected together to receive said analog signal;
   a row of successively arranged anode electrodes each being coated with a layer of fluorescent material for emitting light in response to an impingement of electrons, said anode electrodes being divided into first and second identical groups and the corresponding anode electrodes of the first and second groups being respectively connected together to the output terminals of said comparators;
   a cathode electrode for emitting electrons toward said anode electrodes;
   first and second grid electrodes mounted between said cathode and anode electrodes, said first grid electrode covering the anode electrodes of said first group and said second grid electrode covering the anode electrodes of said second group;
   means for alternately supplying a control potential to said first and second grid electrodes at such intervals that the fluorescent material of said anode electrodes is made to appear to fluoresce continuously; and
   means for causing said graduated reference potentials to vary between a first set of values and a second set of values in synchronism with said control potential supplying means.

7. A level indicator as claimed in claim 6, wherein said reference potential establishing means comprises a voltage divider connected to a voltage source, the voltage divider including a plurality of resistance elements connected in series between a first and a second voltage, and wherein said reference potential varying means comprises a transistor for providing low impedance path across one of said resistance elements in response to a regularly occurring pulse.

8. A level indicator as claimed in claim 7, wherein said reference potential varying means further comprises a second transistor for providing a low impedance path across a substantial portion of said reference elements in response to said regularly occurring pulse.

9. A level indicator as claimed in claim 7, further comprising means for discretely varying the level of said signal in response to said regularly occurring pulse.

* * * * *